US008674725B2

(12) United States Patent
Kurahashi et al.

(10) Patent No.: US 8,674,725 B2
(45) Date of Patent: Mar. 18, 2014

(54) TRANSMITTER CIRCUIT (75) Inventors: Hiroaki Kurahashi, Ome (JP);
Tomofumi Hokari, Akishima (JP);
Takashi Muto, Hamura (JP); Goichi Ono, Soka (JP); Hiroki Yamashita, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/358,324

(22) Filed: Jan. 25, 2012

(65) Prior Publication Data

US 2012/0187980 A1    Jul. 26, 2012

(30) Foreign Application Priority Data

Jan. 26, 2011    (JP) ................. 2011-013795

(51) Int. Cl.
*H03K 19/0175*    (2006.01)
(52) U.S. Cl.
USPC .................. 326/83; 326/82; 326/86; 326/115; 327/108
(58) Field of Classification Search
USPC ......... 326/81–83, 86–87, 112, 115, 119, 121; 327/108–109, 333
See application file for complete search history.

(56) References Cited

U.S. PATENT DOCUMENTS

| | | | |
|---|---|---|---|
| 6,590,432 B1 * | 7/2003 | Wu et al. ........................ 327/108 |
| 6,977,525 B2 | 12/2005 | Komatsu | |
| 6,977,534 B2 * | 12/2005 | Radelinow ..................... 327/112 |
| 7,180,333 B2 | 2/2007 | Tseng | |
| 7,288,971 B1 * | 10/2007 | Plasterer et al. .............. 326/127 |
| 7,825,691 B2 * | 11/2010 | Liu .................................. 326/83 |
| 7,830,167 B2 | 11/2010 | Ono et al. | |
| 7,920,014 B2 | 4/2011 | Nagashima et al. | |
| 7,994,825 B2 | 8/2011 | Ushio et al. | |
| 2006/0238237 A1 * | 10/2006 | Clements et al. ............. 327/557 |
| 2008/0116943 A1 * | 5/2008 | Nair .............................. 327/108 |
| 2009/0289681 A1 * | 11/2009 | Keady et al. .................. 327/179 |
| 2010/0127734 A1 * | 5/2010 | Cheung ......................... 327/77 |
| 2011/0193595 A1 | 8/2011 | Fukuda et al. | |

FOREIGN PATENT DOCUMENTS

| | | |
|---|---|---|
| JP | 2002-026999 A | 1/2002 |
| WO | WO 02/39684 A2 | 5/2002 |

* cited by examiner

*Primary Examiner* — Shawki S Ismail
*Assistant Examiner* — Christopher Lo
(74) *Attorney, Agent, or Firm* — Miles & Stockbridge P.C.

(57) ABSTRACT

A transmitter circuit in which a driver circuit includes MOS transistors for bias voltage application, in which a driving current flows, cascode-connected to MOS transistors for differential signal input controlled by a voltage value of transmitted data signals, controlled by a voltage value of a bias voltage, and driver circuits include MOS transistors for bias voltage application, in which a driving current flows, cascode-connected to MOS transistors for differential signal input that is controlled by a voltage value of signals obtained by the transmitted data signals, connected to a load portion, and controlled by a voltage value of a bias voltage.

4 Claims, 7 Drawing Sheets

TRANSMITTER CIRCUIT

CROSS-REFERENCE TO RELATED APPLICATION

The present application claims priority from Japanese Patent Application No. 2011-013795 filed on Jan. 26, 2011, the content of which is hereby incorporated by reference into this application.

TECHNICAL FIELD OF THE INVENTION

The present invention relates to technology of a transmitter circuit. More particularly, the present invention relates to technology effectively applied to a transmitter circuit provided to a data transmitting system that transmits data to a receiver circuit via transmission paths from the transmitter circuit.

BACKGROUND OF THE INVENTION

There are examples of technology related to a transmitter circuit provided to a data transmitting system which transmits data to a receiver circuit via transmission paths from the transmitter circuit described in U.S. Pat. No. 7,180,333 (Patent Document 1), U.S. Pat. No. 6,977,525 (Patent Document 2), International Patent Application Publication No. WO2002/039684 (Patent Document 3), and Japanese Patent Application Laid-Open Publication No. 2002-26999 (Patent Document 4).

Patent Document 1 describes technology related to a CML (current mode logic) driver which adjusts common mode voltage in a current mode logic driver using a level shift mechanism. Patent Document 2 describes technology of flowing current for correction in a current driver. Patent Document 3 describes technology of waveform equalization using a delay circuit in an output buffer of a data communication system. Patent Document 4 describes technology of waveform equalization using a square wave adding in a transmitter device having compensating means of transmission path loss.

SUMMARY OF THE INVENTION

As to these technologies mentioned above, there is a demand of speeding up information processing devices as broadband connections have been popularized. In high-speed transmission technology, attenuation of data waveforms occurs on the receiver side in transmission paths and the attenuation amount significantly increases as the transmission rate is increased. Thus, on the transmitter side, amplitude is previously reduced to a data waveform having the same successive bits and an emphasis waveform in which the data waveform is emphasized is outputted upon bit transition.

To generate the emphasis waveform, existing transmitter circuits such as those described in Patent Documents 1 to 4 mentioned above are configured with the CML system at the final stage of waveform output. However, in the CML system, when the supply voltage is low, the MOS transistor of the current source operates in the linear region and thus output current for determining the level is insufficient; therefore, the level on the Low side is increased more than a desired level and an unbalance may occur in the emphasis amounts on the High side and Low side.

Therefore, to compensate the insufficient current amount, the output level is compensated by adding a correction circuit corresponding to a defined emphasis amount. However, when a wide range is setting emphasis amount more than a defined value is necessary like a signal conditioner, it is concerned to have the circuit scale increased in existing systems in which the number of correction circuits is determined in accordance with the emphasis amount.

Accordingly, the present invention is a transmitter circuit system devices as a countermeasure of the above-explained situation and a preferred aim of the present invention is to provide a transmitter circuit that is advantageous in the two points, that is, elimination of correction circuits and reduction in occupying area of element circuits and capable of resolving the unbalance of emphasis amount on the High side and Low side of output level.

The above and other preferred aims and novel characteristics of the present invention will be apparent from the description of the present specification and the accompanying drawings.

The typical ones of the inventions disclosed in the present application will be briefly described as follows.

That is, in a transmitter circuit, a cascode connection is configured by vertically stacking one stage of MOS transistor for applying a bias voltage on a drain side of a MOS transistor to which signals are inputted in the existing CML system. Here, it is preferable to set the supply voltage of the CML in the output portion high to a signal input voltage. According to this configuration, a certain output current can be obtained regardless of the output level and thus unbalance of the emphasis amounts on the High side and Low side is resolved.

More specifically, the transmitter circuit includes a waveform-equalizing load driving circuit which performs waveform equalization to transmitted data signals and outputs the waveform-equalized transmitted data signals to transmission paths. The waveform-equalizing load driving circuit is configured by a differential circuit including one current switching circuit and one or a plurality of current adder circuits. The current switching circuit includes: first transistors in which a first driving current flows, controlled by a voltage value of the transmitted data signals; a first current source, to which the first driving current is applied, connected between the first transistors and a ground voltage; second transistors, in which the first driving current flows, cascode-connected to the first transistors and controlled by a voltage value of a first bias voltage; and a load portion, to which the first driving current is applied, connected between the second transistors and a supply voltage. The current adder circuit includes: third transistors, in which a second driving current flows, controlled by a voltage value of signals obtained by delaying the transmitted data signals; a second current source, to which the second driving current flows, connected between the third transistors and a ground voltage; and fourth transistors, in which the second driving current flows, cascode-connected to the third transistors to be connected to the load portion and controlled by a voltage value of a second bias voltage. The load portion performs waveform equalization of the transmitted data signals by converting a current obtained by adding the second driving current to the first driving current into a voltage.

In addition, in another transmitter circuit, the waveform equalization function and the load driving function are separated. According to the configuration, the load capacitance is reduced than an integrated circuit and thus each circuit can be made to be a wideband circuit.

More specifically, the another transmitter circuit includes: a waveform equalizing circuit which performs waveform equalization to transmitted data signals; and a load driving circuit connected separately from the waveform equalizing circuit and outputs the transmitted data signals after the waveform equalization in the waveform equalizing circuit to transmission paths. The load driving circuit is configured by a differential circuit including a first current switching circuit. The first current switching circuit includes: first transistors, in which a first driving current flows, controlled by a voltage value of the transmitted data signals at an output of the waveform equalizing circuit; a first current source, to which the first driving current is applied, connected between the first transistors and a ground voltage; second transistors, in which the first driving current flows, cascode-connected to the first transistors and controlled by a voltage value of a first bias voltage; and a first load portion, to which the first driving current is applied, connected between the second transistors and a supply voltage.

More preferably, the waveform equalizing circuit is configured by a differential circuit including one second current switching circuit and one or a plurality of current adder circuits. The second current switching circuit includes: third transistors, in which a second driving current flows, controlled by a voltage value of the transmitted data signals; a second current source, to which the second driving current is applied, connected between the third transistors and a ground voltage; fourth transistors, in which the second driving current flows, controlled by a voltage of a second bias voltage; and a second load portion, to which the second driving current is applied, connected between the fourth transistors and a supply voltage. The current adder circuit includes: fifth transistors, in which a third driving current flows, controlled by a voltage value of signals obtained by delaying the transmitted data signals; a third current source, to which the third current flows, connected between the fifth transistors and a ground voltage; and sixth transistors, in which the third driving current flows, cascode-connected to the fifth transistors to be connected to the second load portion and controlled by a voltage value of a third bias voltage. The second load portion performs waveform equalization of the transmitted data signals by converting a current obtained by adding the third driving current to the second driving current into a voltage.

The effects obtained by typical aspects of the present invention will be briefly described below.

That is, in a transmitter circuit, it is possible to eliminate correction circuits and reduce an occupying area of element circuits and thus unbalance in the emphasis amounts on High side and Low side of an output level without level correction can be resolved upon level output of three-valued or more. As a result, an occupying area of the transmitter circuit can be reduced more than existing transmitter circuits and thus downsizing of the chip size can be achieved.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols in principle throughout the drawings for describing the embodiment, and the repetitive description thereof will be omitted.

OUTLINE OF THE EMBODIMENTS OF THE PRESENT INVENTION

<First Transmitter Circuit of an Embodiment of the Present Invention>

A first transmitter circuit according to an embodiment of the present invention includes a waveform-equalizing load driving circuit which performs waveform equalization to transmitted data signals and outputs the transmitted data signals after the waveform equalization to transmission paths. The waveform-equalizing load driving circuit is configured by a differential circuit including one current switching circuit (driver circuit 17 (MAIN drv.)) and one or a plurality of (two in the illustrated example of the embodiment) current adder circuits (driver circuits 16 (PRE drv.) and 18 (POST drv.)).

The current switching circuit includes: first transistors (MOS transistors M1$p$, M1$n$), in which a first driving current flows, controlled by a voltage value of the transmitted data signals; a first current source (MOS transistor M2 for current source), to which the first driving current is applied, connected between the first transistors and a ground voltage; second transistors (MOS transistors M3p, M3n), in which a second driving current flows, cascode-connected to the first transistors and controlled by a voltage value of a first bias voltage; and load portions (load resistors R1p, R1n), to which the first driving current is applied, connected between the second transistors and a supply voltage.

The current adder circuit includes: third transistors (MOS transistors M1p, M1n for differential signal input), in which a second driving current flows, controlled by a voltage value of signals obtained by delaying the transmitted data signals; a second current source (MOS transistor M2 for current source), to which the second driving current flows, connected between the third transistors and a ground voltage; and fourth transistors (MOS transistors M3p, M3n for applying bias voltage), in which the second driving current flows, cascode-connected to the third transistors to be connected to the load portions and controlled by a voltage value of a second bias voltage.

The load portions equalize a waveform of the transmitted data signals by converting a current obtained by adding the second driving current to the first driving current into a voltage.

The first transmitter circuit according to the embodiment of the present invention having the above-described features corresponds to a first embodiment described later.

<Second Transmitter Circuit according to an Embodiment of the Present Invention>

A second transmitter circuit according to an embodiment of the present invention includes: a waveform equalizing circuit which performs waveform equalization to transmitted data signals; and a load driving circuit which is connected separately from the waveform equalizing circuit and outputs the transmitted data signals after the waveform equalization by the waveform equalizing circuit to transmission paths.

The load driving circuit is configured by a differential circuit having a first current switching circuit (load driver circuit 21).

The first current switching circuit includes: first transistors (MOS transistors M11p, M11n for differential signal input), in which a first driving current flows, controlled by a voltage value of transmitted data signals at an output of the waveform equalizing circuit; a first current source (MOS transistor M12 for current source), to which the first driving current is applied, connected between the first transistors and a ground voltage; second transistors (MOS transistors M13p, M13n for applying bias voltage), in which the first driving current flows, cascode-connected to the first transistors and controlled by a voltage value of a first bias voltage; and first load portions (load resistors R1p, R1n), to which the first driving current is applied, connected between the second transistors and a supply voltage.

The waveform equalizing circuit is configured by a differential circuit which includes one second current switching circuit (driver circuit 17 (MAIN drv.)) and one or a plurality of (two in the example illustrated in the embodiment) current adder circuits (driver circuit 16 (PRE dry.)) and 18 (POST drv.)).

The second current switching circuit includes: third transistors (MOS transistors M1p, M1n for differential signal input), in which a second driving current flows, controlled by a voltage value of the transmitted data signals; a second current source (MOS transistor M2 for current source), to which the second driving current is applied, connected between the third transistors and a ground voltage; fourth transistors (MOS transistors M3p, M3n for applying bias voltage), in which the second driving current flows, controlled by a voltage value of a second bias voltage; and second load portions (load resistances R2p, R2n), to which the second driving current flows, connected between the fourth transistors and a source voltage.

The current adder circuit includes: fifth transistors (MOS transistors M1p, M1n for differential signal input), in which a third driving current flow, controlled by a voltage value of signals obtained by delaying the transmitted data signals; a third current source (MOS transistor M2 for current source) to which the third driving current is applied, connected between the fifth transistor and a ground voltage; and sixth transistors (MOS transistors M3p, M3n for applying bias voltage), in which the third driving current flows, controlled by a voltage value of a third bias voltage.

The second load portions equalize a waveform of the transmitted data signals by converting a current obtained by adding the third driving current to the second driving current into a voltage.

The second transmitter circuit according to the embodiment of the present invention having the above-described features corresponds to a second embodiment described later.

Hereinafter, each embodiment based on the summary of the embodiments of the present invention described above will be concretely described. The embodiments described below are examples of using the present invention, and the present invention is not limited to the following embodiments.

Note that, the same references may be applied to a name of a signal and a name of a terminal. In addition, a reverse signal of a differential signal will be added with '/' at the head of the differential signal to discriminate from its normal signal.

First Embodiment

A first embodiment of the present invention will be described hereinafter with reference to FIGS. 1 to 5. A transmitter circuit according to the first embodiment is an example of a type not separating the waveform-equalizing function and the load-driving function.

<Configuration and Operation of Transmitter Circuit>

Figure 1:
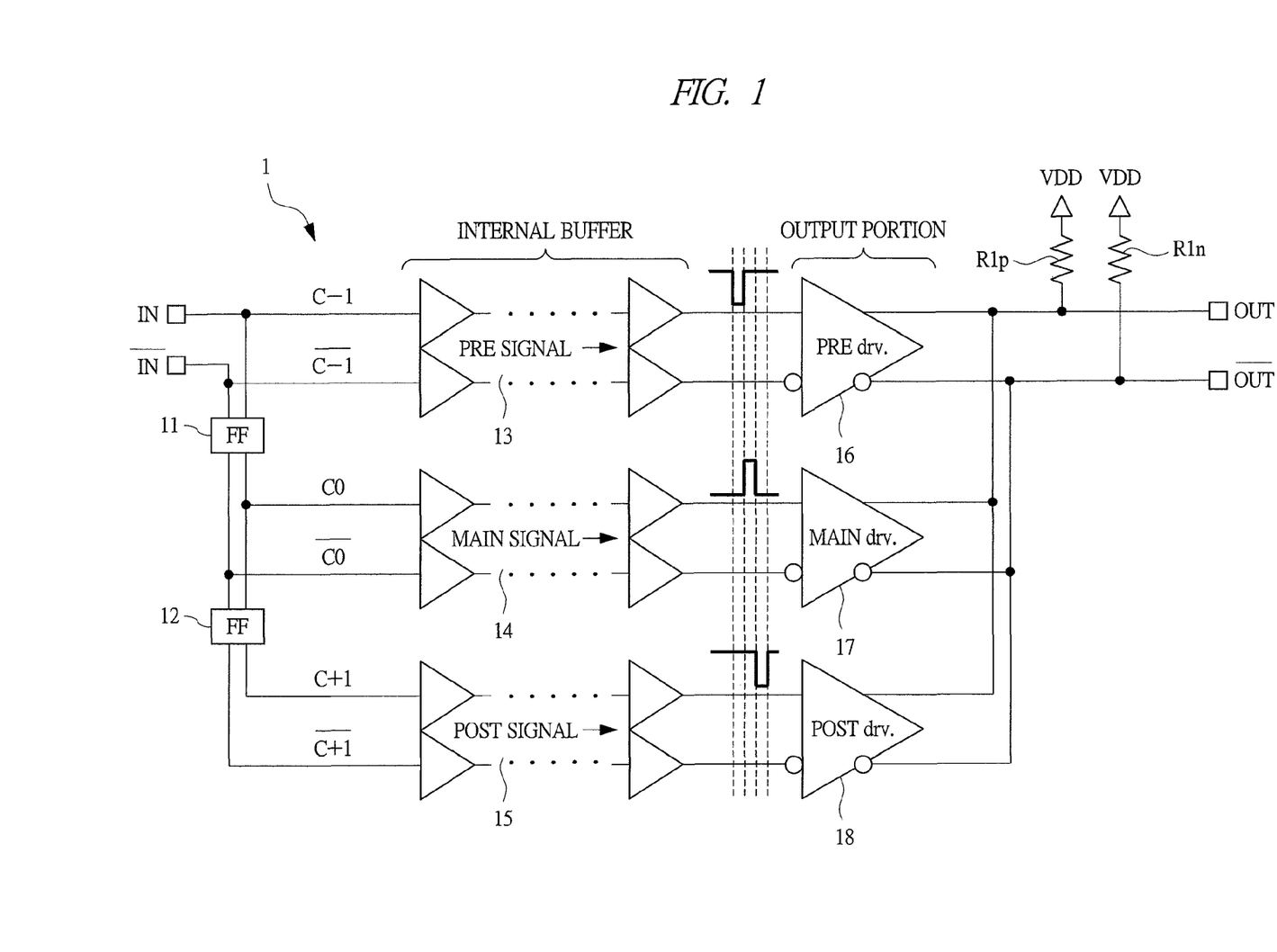
FIG. 1 is a diagram illustrating an example of a configuration of a transmitter circuit according to a first embodiment of the present invention.

First, a configuration of a transmitter circuit according to a first embodiment will be described with reference to FIG. 1. FIG. 1 is a diagram illustrating an example of a configuration of the transmitter circuit.

A transmitter circuit 1 of the first embodiment includes: two flip-flop circuits 11 and 12; three buffer circuits 13, 14, and 15 as internal buffers; three driver circuits 16 (PRE drv.), 17 (MAIN dry.), and 18 (POST dry.) as output portions; and load resistors R1p and R1n, etc. Differential transmitted data signals are inputted to input terminals (In, /IN) and then waveform-equalized, and further signal-amplified and then outputted as differential transmitted data signals to output terminals (OUT, /OUT).

The flip-flop circuits 11 and 12 include: the first flip-flop circuit 11 connected to the input terminals (IN, /IN) to which the transmitted data signals are inputted and latching the transmitted data signals; and a second flip-flip circuit 12 connected to outputs of the first flip-flop circuit 11 and latching output signals from the flip-flop circuit 11.

The buffer circuits 13 to 15 include: the first (PRE) buffer circuit 13 connected to the input terminals (IN, /IN) and buffering transmitted data signals (C−1, /C−1) inputted to the first buffer circuit 13; the second (MAIN) buffer circuit 14 connected to the outputs of the first flip-flip circuit 11 and buffering transmitted data signals (C0, /C0) inputted to the second buffer circuit 14; and the third (POST) buffer circuit 15 connected to outputs of the second flip-flop circuit 12 and buffering transmitted data signals (C+1, /C+1) inputted to the third buffer circuit 15.

The driver circuits 16 to 18 include: the first (PRE) driver circuit 16 connected to an output of the first buffer circuit 13 and performing waveform equalization and signal amplification on the buffered transmitted data signals (C−1, /C−1); the second (MAIN) driver circuit 17 connected to an output of the second buffer circuit 14 and performing waveform equalization and signal amplification on the buffered transmitted data signals (C0, /C0); and the third (POST) driver circuit 18 connected to an output of the third buffer circuit 15 and performing waveform equalization and signal amplification on the buffered transmitted data signals (C+1, /C+1).

Outputs of the first to third driver circuits 16 to 18 are commonly connected to output terminals (OUT, /OUT). In addition, to the output terminals (OUT, /OUT), for impedance matching with the transmission paths, the load resistors R1$p$ and R1$n$ are connected between the output terminals and a supply voltage VDD. The load resistors R1$p$ and R1$n$ are, for example, resistors of 50 Ω.

In the first embodiment, the two flip-flop circuits 11 and 12 are connected in series, and a shift circuit is configured such that the transmitted data signals reach the output of the second flip-flop circuit 12 via the first flip-flop circuit 11 in accordance with two clock signals. Output signals of the first flip-flop circuit 11 retain input signals of the transmitted data signals at this time and the output signals become input signals (MAIN signals) of the second buffer circuit 14. Output signals of the second flip-flop circuit 12 retain signals one-bit after the input signals of the transmitted data signals in a cycle of the clock signals, and the output signals become input signals (POST signals) of the third buffer circuit 15. Input signals (PRE signals) of the first buffer circuit 13 are signals one-bit before the input signals of the transmitted data signals at the time in the cycle of the clock signals.

Figure 2:
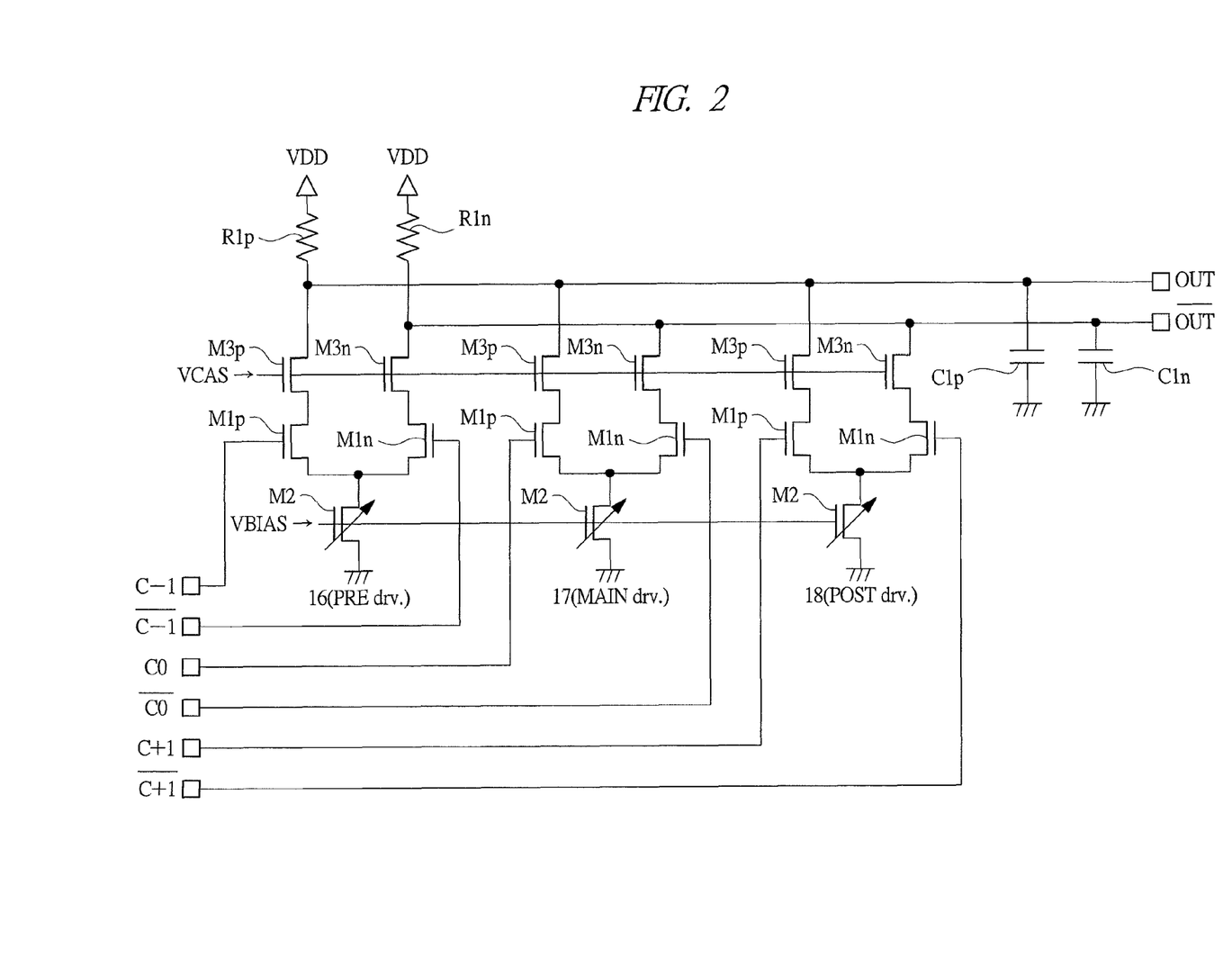
FIG. 2 is a diagram illustrating a circuit configuration of a driver circuit in the transmitter circuit according to the first embodiment of the present invention.

Also, in the first embodiment, the three driver circuits 16 to 18 are, although details will be described below with reference to FIG. 2, configure an adder circuit including a CML circuit. The three driver circuits 16 to 18 have a function of adding outputs of three CML circuits by short-circuiting output points of respective differential transmitted data signals among the three CML circuits and connecting the output points to the common load resistors R1$p$ and R1$n$. For example, the driver circuit 17 (MAIN drv.) operates as a current switching circuit and the driver circuit 16 (PRE drv.) and the driver circuit 18 (POST drv.) operate as current adder circuits. Moreover, the three driver circuits 16 to 18 are connected to the corresponding buffer circuits 13 to 15, respectively, and amplify input signals from the buffer circuits 13 to 15.

Operations of the transmitter circuit 1 illustrated in FIG. 1 described above will be described.

When taking the output signals of the first flip-flop circuit 11 as reference signals, the output signals of the second flip-flop circuit 12 are signals one-bit after the reference signals in terms of a signal rate. The waveform equalizing function by the first driver circuit 16 taking one-bit-before signals (PRE signal) as an input, the second driver circuit 17 taking the reference signals as an input, and the third driver circuit 18 taking one-bit-after signals (POST signal) as an input is for an operation of applying an amplitude correction to signal amplitude of the reference signals using signs of the one-bit-before and one-bit-after signals.

For example, when the sign of the one-bit-before signal is at a High level, the signal amplitude of the reference signal can be decreased only by a setting amount of the current of the first driver circuit 16 which receives an output of the one-bit-before signal. Also, when the sign of the one-bit-after signal is High level, the signal amplitude of the reference signal can be increased only by a setting amount of the third driver circuit 18 which receives an output of the second flip-flop circuit 12. That is, the waveform equalizing function of the transmitter circuit 1 has two amplitude correcting circuits and one of them includes the first buffer circuit 13 and the first driver circuit 16, and the other includes the second flip-flop circuit 12, the third buffer circuit 15, and the third driver circuit 18.

<Circuit Configuration and Operations of Driver Circuits>

Next, with reference to FIG. 2, a circuit configuration of the driver circuits 16 to 18 described above will be described. FIG. 2 is a diagram illustrating an example of a circuit configuration of the driver circuits 16 to 18.

Each of the driver circuits 16 to 18 of the first embodiment is configured by: the MOS transistors M1$p$, M1$n$ for differential signal input; the MOS transistors M2 having their drain side connected to a source side of the MOS transistors M1$p$, M1$n$ for differential signal input and having their source side connected to a ground voltage; the MOS transistors M3$p$, M3$n$ for bias voltage application having their source side connected to the drain side of the MOS transistors M1$p$, M1$n$ for differential signal input; etc. To a drain side of the MOS transistors M3$p$, M3$n$ for bias voltage application of these driver circuits 16 to 18, the load resistors R1$p$, R1$n$ are connected between the drain side and the supply voltage VDD, and the load capacitors C1$p$, C1$n$ are connected between the drain side and a ground voltage.

In the driver circuits 16 to 18, the MOS transistors M1$p$, M1$n$ for differential signal input of the driver circuit 16 are controlled by a voltage value of the transmitted data signals (C−1, /C−1); the MOS transistors M1$p$, M1$n$ for differential signal input of the driver circuit 17 are controlled by a voltage value of the transmitted data signals (C0, /C0); and the MOS transistors for differential signal input of the driver circuit 18 are controlled by a voltage value of the transmitted data signals (C+1, /C+1). In addition, the MOS transistor for current source M2 of each of the driver circuits 16 to 18 is controlled by a voltage value (VBIAS) that will be described later; and the MOS transistors M3$p$, M3$n$ for bias voltage application of each of the driver circuits 16 to 18 are controlled by a voltage value (VCAS) that will be described later.

That is, each of the driver circuits 16 to 18 has a cascode connection by vertically stacking one stage of the MOS transistors M3$p$, M3$n$ for bias voltage application on the drain side of the MOS transistors M1$p$, M1$n$ for differential signal input of a CML circuit. That is so-called cascade-connected CML circuit. Here, the supply voltage VDD of each of the driver circuits 16 to 18 is set to be higher than a signal input voltage. According to this configuration, a constant output current can be obtained regardless of an output level, so that an unbalance in the emphasis amounts of the High side and Low side can be eliminated.

Figure 3:
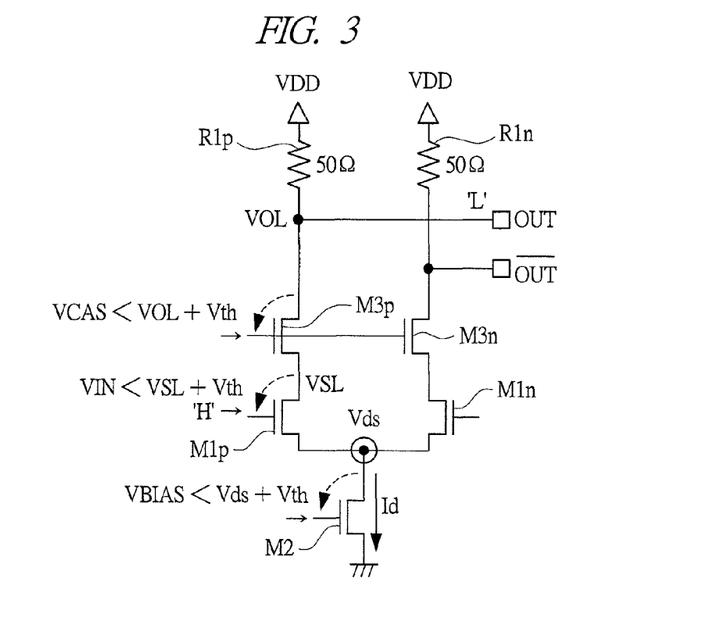
FIG. 3 is a diagram describing an example of operation of a single driver circuit in the transmitter circuit according to the first embodiment of the present invention.
Figure 4:
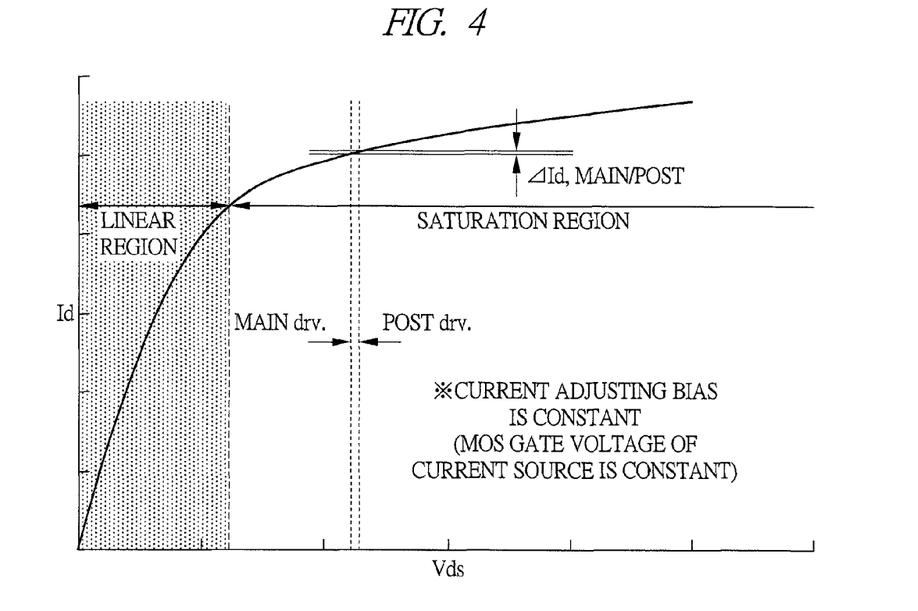
FIG. 4 is a diagram describing an example of a fluctuation range of a drain-source voltage of a MOS transistor for current source of the single driver circuit in the transmitter circuit according to the first embodiment of the present invention.
Figure 5:
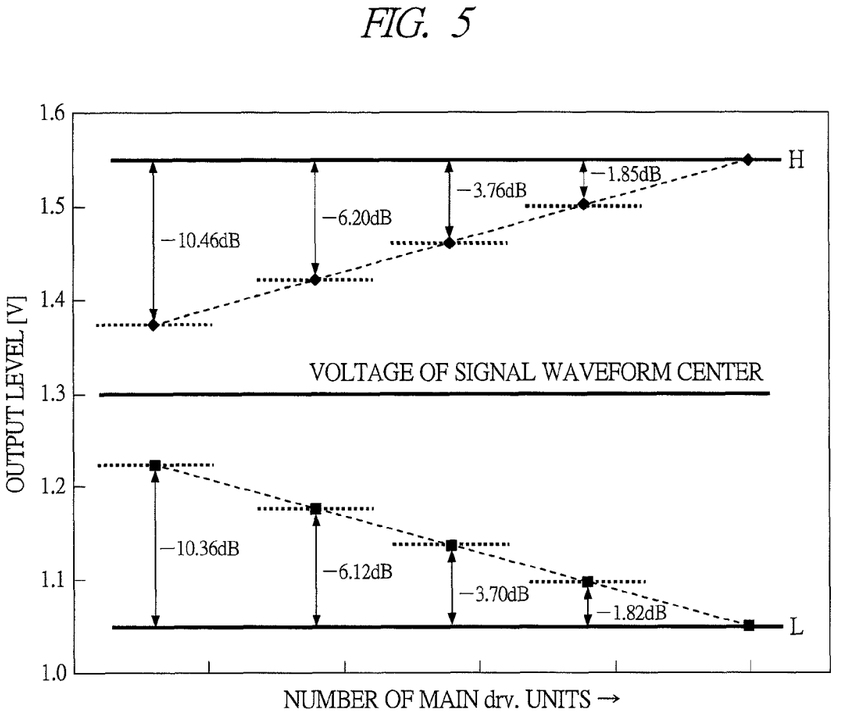
FIG. 5 is a diagram describing an example of an output level of the single driver circuit in the transmitter circuit according to the first embodiment of the present invention.

Next, with reference to FIGS. 3 to 5, operations of the driver circuits 16 to 18 will be described. FIG. 3 is a diagram for describing an example of an operation of a single driver circuit of the driver circuits 16 to 18. FIG. 4 is a diagram for describing an example of a fluctuation range of a drain-source voltage Vds of the MOS transistor for current source M2 of a single driver circuit of the driver circuits 16 to 18. FIG. 5 is a diagram for describing an example of an output level of a single driver circuit of the driver circuits 16 to 18.

As described above, each of the driver circuits 16 to 18 of the first embodiment is configured by the MOS transistors M1$p$, M1$n$ for differential signal input, the MOS transistor M2 for current source; the MOS transistors M3p, M3n for bias voltage application, etc. And, for example, in FIG. 3, when a signal at a 'High (H)' level is inputted to a gate of one of the MOS transistors for differential signal input, i.e., the MOS transistor M1p for differential signal input, a signal at a 'Low (L)' level is outputted as an output (OUT) of the MOS transistor M1p. Here, a signal at the 'L' level is inputted to the gate of the other MOS transistor M1n and thus an output (/OUT) of the MOS transistor M1n is a signal at the 'H' level.

Particularly, in the first embodiment, to the drain side of the MOS transistors M1p, M1n for differential signal input, one stage of the MOS transistors M3p, M3n for bias voltage application is vertically stacked to configure a cascode connection. And, for example, the supply voltage VDD is set to 1.8 V which is a voltage value higher than the signal input voltage to the MOS transistors M1p, M1n for differential signal input and settings are made as follows to operate the MOS transistors M1p, M1n, M2, M3p, and M3n in a saturation region.

First, the gate voltage (VCAS) of the MOS transistors M3p, M3n for bias voltage application is set to be lower than a value (VOL+Vth) obtained by adding a threshold voltage (Vth) of the MOS transistor to the output 'L' level (VOL) to operate the MOS transistors in the saturation region. A size of a channel width (W) of the MOS transistors M3p, M3n for bias voltage application is set to be large to prevent voltage drop due to on resistance. According to the settings, a condition for guaranteeing the saturation characteristics (VCAS<VOL+Vth) can be satisfied.

A signal (VIN) having an amplitude of 1 V is inputted to the MOS transistors M1p, M1n for differential signal input. The drain voltage (VSL) of the MOS transistors M1p, M1n for differential signal input is set to be larger than a voltage (1−Vth) which is lower than 1 V by Vth. A device size (channel width (W)/gate length (Lg)) is required to be as small as possible to guarantee a switching speed, and is set to be a minimum value within a range that is not affected by a lowering of the drain-source voltage (Vds) of the MOS transistor M2 for current source due to voltage drop. According to these settings, conditions for guaranteeing saturation characteristics (VIN<VSL+Vth) can be satisfied.

Also, the MOS transistor M2 for current source has a small margin in the saturation region due to voltage drop influenced by the MOS transistors M3p, M3n for bias voltage application and the MOS transistors M1p, M1n for differential signal input. However, the MOS transistor M2 for current source is also set at a value lower than a value obtained by adding Vth to Vds for guaranteeing operations in the saturation region same as the above-described manner. Therefore, to obtain a drain current (Id) at a low current adjusting bias (VBIAS), a size of channel width (W) is set to be large, and a size of gate length (Lg) is set to be large for improving saturation current characteristics. According to these settings, a condition for guaranteeing saturation characteristics (VBIAS<Vds+Vth) can be satisfied.

By satisfying the above-described conditions, as illustrated as an example in FIG. 4, a fluctuation amount of the drain-source voltage Vds of the MOS transistor M2 for current source is suppressed and an output current Id is stabilized. That is, in the relationship of Vds and Id of the MOS transistor M2 for current source between the driver circuit 17 (MAIN dry.) and the driver circuit 18 (POST dry.) illustrated in FIG. 4, a difference from Vds of the MOS transistor M2 for current source of the driver circuit 17 and Vds of the MOS transistor M2 for current source of the driver circuit 18 is small, resulting in a small fluctuation amount (ΔId) between Id of the MOS transistor M2 for current source of the driver circuit 17 and Id of the MOS transistor M2 for current source of the driver circuit 18.

Although not illustrated, the same goes to a fluctuation amount (ΔId) between Id of the MOS transistor M2 for current source of the driver circuit 17 (MAIN dry.) and Id of the MOS transistor M2 for current source of the driver circuit 16 (PRE dry.), and thus the fluctuation amount (ΔId) between Id of the MOS transistor M2 for current source of the driver circuit 17 and Id of the MOS transistor M2 for current source of the driver circuit 16 is small.

As described above, as a fluctuation amount of the drain-source voltage Vds of the MOS transistor M2 for current source is suppressed and the output current Id is stabilized, as illustrated as an example in FIG. 5, an unbalance in the emphasis amounts of the High (H) side and the Low (L) side can be eliminated in the output levels of the driver circuits 16 to 18. That is, in a relationship of a unit number and an output level of the driver circuit 17 (MAIN dry.) illustrated as an example in FIG. 5, a situation in which a center voltage of a signal waveform is about 1.3 V, the H level is about 1.55 V and the L level is about 1.05 V is considered. For example, when the unit number is around the minimum, a middle output level to the H level is −10.46 dB on the H side and −10.36 dB on the L side, and thus emphasis amounts of the H side and L side are substantially equal. In addition, when the unit number is increased, the output level on the H side is −6.20 dB and −6.12 dB on the L side, −3.76 dB on the H side and −3.70 dB on the L side, −1.85 dB on the H side and −1.82 dB on the L side, and thus emphasis amounts on the H side and L side are substantially equal in the same manner.

Note that, although not illustrated, the same goes to the driver circuit 16 (PRE dry.), the driver circuit 18 (POST dry.), and the emphasis amounts on the H side and L side are substantially equal.

As described above, it is possible to eliminate an unbalance in the emphasis amounts on the H side and L side to different level outputs of three-valued or more per an emphasis setting.

<Effect of the First Embodiment>

According to the transmitter circuit 1 of the first embodiment described in the foregoing, the following effects can be achieved.

(1) One stage of the MOS transistors M3p, M3n for bias voltage application is vertically stacked on the drain side of the MOS transistors M1p, M1n for differential signal input to configure a cascode connection and each of the MOS transistors M1p, M1n, M2, M3p and M3n is operated in a saturation region, so that a fluctuation amount of drain-source voltage of the MOS transistor M2 for current source upon output level fluctuation can be suppressed to the minimum and thus it is possible to obtain a constant current.

(2) Further, by setting the supply voltage higher than the signal input voltage, operation of each of the MOS transistors M1p, M1n, M2, M3p and M3n in a saturation region is guaranteed and the fluctuation amount of the drain-source voltage of the MOS transistor M2 for current source along with fluctuation of the output level can be further reduced. Therefore, the current can be more stable. As a result, current shortage upon Low-level output can be eliminated and emphasis amounts on the High side and Low side can be equalized.

(3) Moreover, in the transmitter circuit 1, it is possible to make a correcting circuit unnecessary and to reduce an occupying area of element circuits and thus it is possible to eliminate an unbalance in emphasis amounts on High level and Low level of the output levels without a level correction upon level output of three-leveled or more. As a result, the occupying area of the transmitter circuit can be reduced than existing ones and thus the chip size can be reduced.

<Variation of the First Embodiment>

(1) While an example of operating the MOS transistors M1p, M1n for differential signal input in a saturation region has been described in the first embodiment, the same effects can be achieved by operating the MOS transistors M3p, M3n for bias voltage application of the cascode connection even in a situation of operating the MOS transistors M1p, M1n for differential signal input in a linear region.

(2) While an example of connecting the load resistors R1p, R1n as a load portion of an impedance matching with the transmission paths, the load portion may be a resistor and an inductor connected in series.

Second Embodiment

Figure 6:
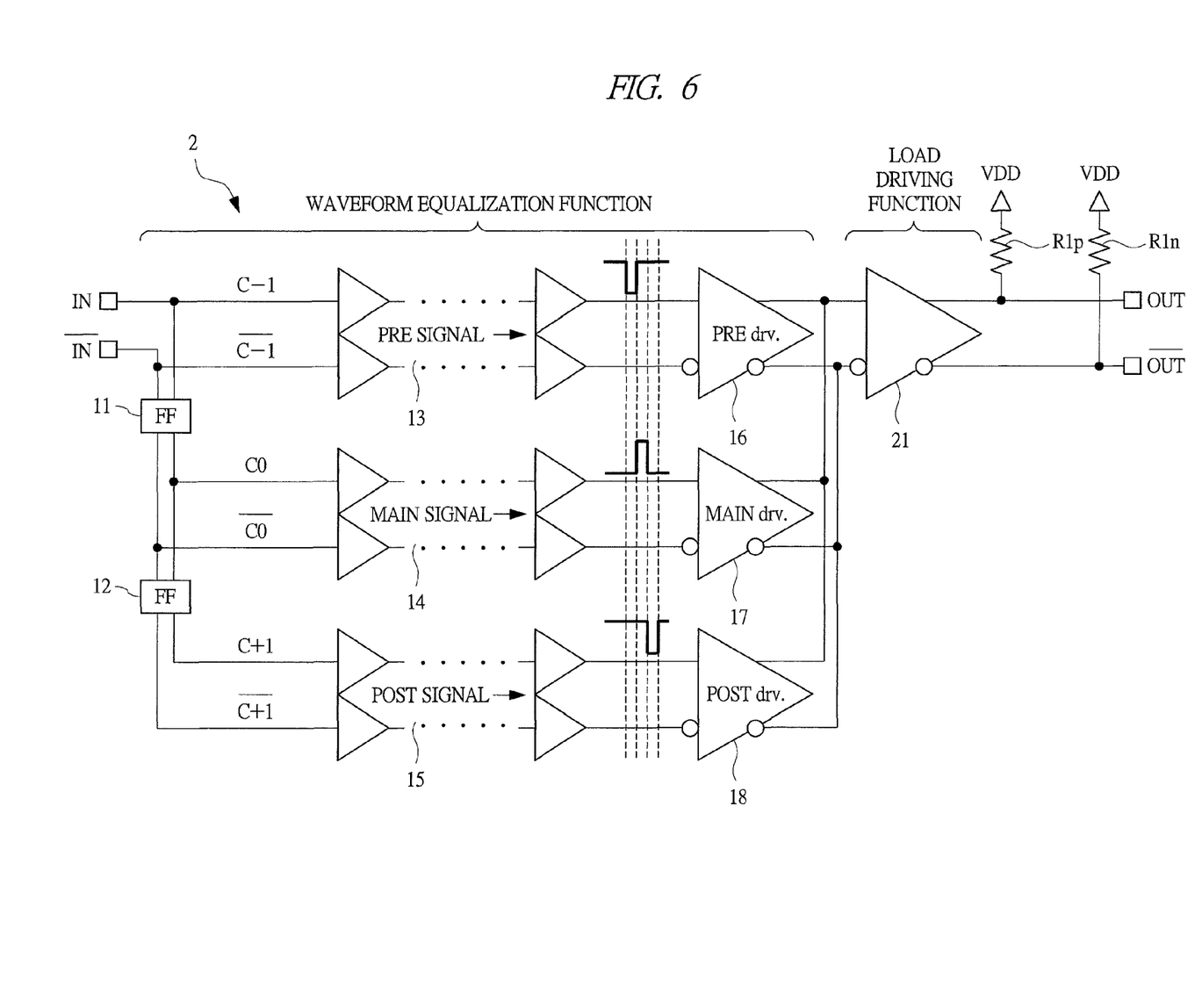
FIG. 6 is a diagram illustrating an example of a configuration of a transmitter circuit according to a second embodiment of the present invention.

A second embodiment of the present invention will be described with reference to FIGS. 6 to 8. A transmitter circuit according to the second embodiment is different from that of the first embodiment in a point that the second embodiment is an example of a type having the waveform-equalizing function and the load-driving function separated. In the second embodiment, the difference from the first embodiment will be mainly described and descriptions of identical portions will be omitted.

<Configuration and Operations of Transmitter Circuit>

First, a configuration and operations of a transmitter circuit of the second embodiment will be described with reference to FIG. 6. FIG. 6 is a diagram illustrating an example of a configuration of the transmitter circuit.

A transmitter circuit 2 of the second embodiment is configured by two flip-flop circuits 11 and 12, three buffer circuits 13, 14 and 15, three driver circuits 16 (PRE dry.), 17 (MAIN dry.) and 18 (POST dry.), load resistors R1p and R1n, a load driver circuit 21, and etc.

And, the flip-flop circuits 11, 12, the buffer circuits 13 to 15, and the driver circuits 16 to 18 operate as a waveform-equalizing function. The load driver 21 has a gain of one or more and operates as a load-driving function. For example, in the driver circuits 16 to 18 operated as the waveform-equalizing function, the driver circuit 17 (MAIN dry.) is operated as a current switching circuit and the driver circuit 16 (PRE dry.) and the driver circuit 18 (POST dry.) operating as current adder circuits. Also, the load driver circuit 21, which operates as a load-driving function, operates as a current switching circuit.

<Configuration and Operations of Driver Circuits>

Next, with reference to FIG. 7, a configuration and operations of the driver circuits 16 to 18 will be described. FIG. 7 is a diagram illustrating an example of a configuration of the driver circuits 16 to 18.

Each of the driver circuits 16 to 18 of the second embodiment is, in the same manner as the first embodiment, configured by the MOS transistors M1p, M1n for differential signal input, the MOS transistor for current source M2 having a drain side connected to a source side of the MOS transistors M1p, M1n for differential signal input and having a source side connected to a ground voltage, and the MOS transistors M3p, M3n for bias voltage application having a source side connected to a drain side of the MOS transistors M1p, M1n for differential signal input, etc. To a drain side of the MOS transistors M3p, M3n for bias voltage application of the driver circuits, the load resistors R2p, R2n are connected between the drain side and the supply voltage VDD, and the load capacitors C1p, C1n are connected between the drain side and the ground voltage.

In the driver circuits 16 to 18, the MOS transistors M1p, M1n for differential signal input of the driver circuit 16 are controlled by a voltage value of the transmitted data signals (C−1, /C−1); the MOS transistors M1p, M1n for differential signal input of the driver circuit 17 are controlled by a voltage value of the transmitted data signals (C0, /C0); and the MOS transistors M1p, M1n for differential signal input of the driver circuit 18 are controlled by a voltage value of the transmitted data signals (C+1, /C+1). In addition, the MOS transistor M2 for current source of each of the driver circuits 16 to 18 is controlled by a voltage value (VBIAS) that will be described later; and the MOS transistors M3p, M3n for bias voltage application of each of the driver circuits 16 to 18 are controlled by a voltage value (VCAS).

In addition, each of the driver circuits 16 to 18 operates in the same manner as the first embodiment. That is, outputs of the three driver circuits 16 to 18 are added as being connected to the common load resistors R2p, R2n and outputted to the load driver circuit separately connected as a load-driving function.

Each of the driver circuits 16 to 18 of the second embodiment does not need loads of 50Ω as the load resistors R2p, R2n as compared with the first embodiment. Therefore, the driving current to flow in each of the MOS transistors M1p, M1n, M2, M3p and M3n can be small. As a result, sizes of the MOS transistors can be small.

<Configuration and Operations of the Load-Driving Circuit>

Next, a configuration and operations of the load driver 21 described above will be described with reference to FIGS. 7 and 8. FIG. 8 is a diagram for describing an example of gain characteristics resulted from separation of the load driver circuit 21.

Figure 7:
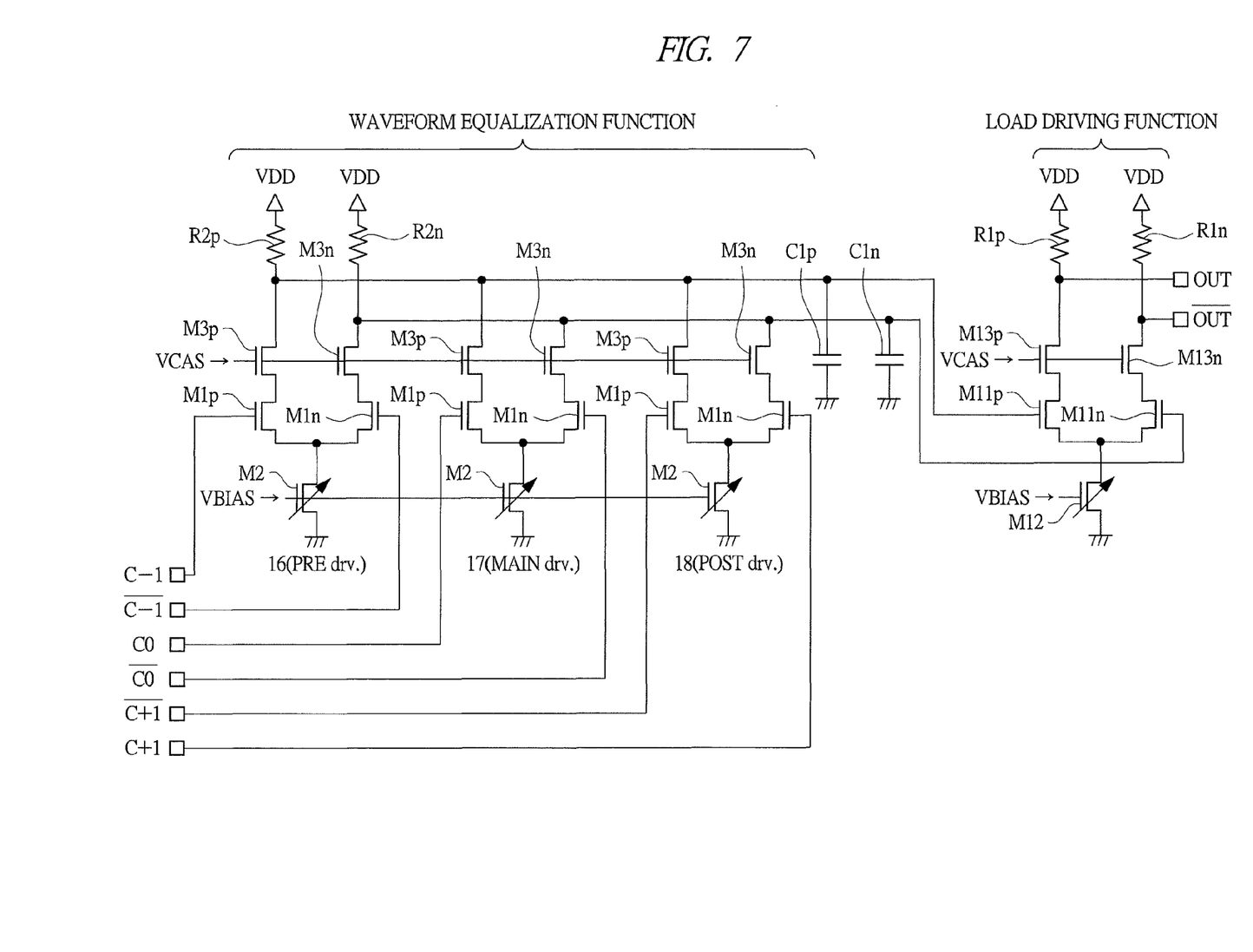
FIG. 7 is a diagram illustrating an example of a circuit configuration of a driver circuit and a load driver circuit in the transmitter circuit according to the second embodiment of the present invention.

The load driver circuit 21 of the second embodiment has a gain of one or more and, as illustrated in FIG. 7, with taking transmitted data signals outputted from the waveform-equalizing function including the flip-flop circuits 11 and 12, the buffer circuits 13 to 15, and the driver circuits 16 to 18 as input, the load driver circuit 21 is configured by: MOS transistors M11p and M11n for differential signal input; a MOS transistor M12 for current source having a drain side connected to a source side of the MOS transistors M11p, M11n for differential signal input and having a source side connected to a ground voltage; MOS transistors M13p, M13n for bias voltage application having a source side connected to a drain side of the MOS transistors M11p, M11n for differential signal input; etc. To a drain side of the MOS transistors M13p, M13n for bias voltage application for applying a bias voltage of the load driver circuit 21, the load resistors Rip, R1n between the drain side and a supply voltage VDD.

In the load driver circuit 21, the MOS transistors M11p, M11n for differential signal input are controlled by a voltage value of transmitted data signals outputted from the waveform-equalizing function, the MOS transistor M12 for current source is controlled by a voltage value (VBIAS), and the MOS transistors M3p, M3n for bias voltage application are controlled by a voltage value (VCAS).

And, the load driver circuit 21 performs the same operations as a single driver circuit of the driver circuits 16 to 18 described above except for taking the transmitted data signals outputted from the waveform-equalizing function including the flip-flop circuits 11, 12, the buffer circuits 13 to 15, and the driver circuits 16 to 18.

Figure 8:
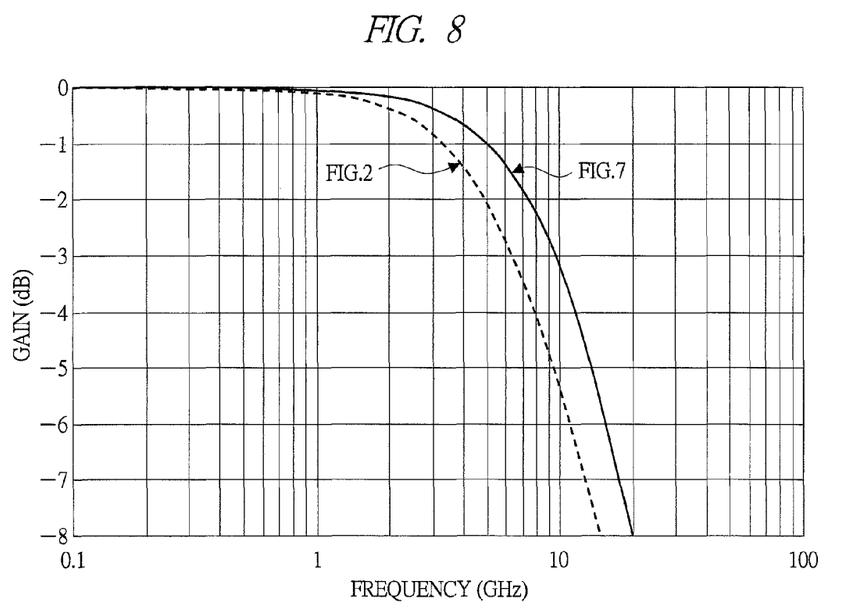
FIG. 8 is a diagram describing an example of gain characteristics resulting from separation of the load driver circuit in the transmitter circuit according to the second embodiment of the present invention.

As described above, the gain characteristics to frequency as illustrated in FIG. 8 are obtained as the load-driving function by the load driver circuit 21 is operated being connected separately from the waveform-equalizing function including the flip-flop circuits 11, 12, the buffer circuits 13 to 15, and the driver circuits 16 to 18. That is, as compared with the configuration (FIG. 2) of the first embodiment described above, the configuration (FIG. 7) of the second embodiment can obtain high gain characteristics to a high frequency range.

<Effects of the Second Embodiment>

According to the transmitter circuit 2 of the second embodiment as described in the foregoing, the following effects in addition to those of the first embodiment can be obtained.

(1) By separating the waveform-equalizing function including the flip-flop circuits 11, 12, the buffer circuits 13 to 15 and the driver circuits 16 to 18 from the load-driving function including the load driver circuit 21, the load capacitance is reduced than an integrated type of circuit, and each circuit can be a high bandwidth circuit.

(2) In addition, as a load of 50Ω is unnecessary in the circuit of the waveform-equalizing function, further load reduction and power consumption reduction can be possible.

(3) Moreover, by giving one or more gains to the load driver circuit 21, the circuit of the waveform-equalizing function and the input of the load driver circuit 21 can be a low-amplitude circuit, and thus it can be a high bandwidth circuit.

<Variation of the Second Embodiment>

(1) While an example of configuring each of the driver circuits 16 to 18 by a so-called cascode-connected CML circuit has been described in the second embodiment, the configuration may also be such that the MOS transistors M3p, M3n for bias voltage application are not provided and the load resistors are directly connected to the drain side of the MOS transistors M1p, M1n for differential signal input.

(2) While an example of configuring the load driver circuit 21 by a so-called cascode-connected CML circuit has been described in the second embodiment, the configuration may be such that the MOS transistors M13p, M13n are not provided and the load resistors are directly connected to the drain side of the MOS transistors M11p, M11n for differential signal input.

(3) While an example of connecting the load resistors R1p, R1n as a load portion of an impedance matching with the transmission paths has been described in the second embodiment, the load portion may be a resistor and an inductor connected in series.

(4) While an example of connecting the load resistors R2p, R2n to the drain side of the MOS transistors M3p, M3n for bias voltage application of each of the driver circuits 16 to 18 has been described in the second embodiment, connecting resistors connected in series and an inductor is also possible.

[Excursus]

When a main feature lies in that the waveform-equalizing function and the load-driving function are separated and the load driving circuit for the load driving function has a gain larger than one on the basis of that, the configuration is in the following manner.

(1) A transmitter circuit including: a waveform-equalizing circuit performing waveform equalization to transmitted data signals; and a load driving circuit connected separately from the waveform-equalizing circuit and outputting the transmitted data signals after the waveform equalization by the waveform-equalizing circuit to transmission paths, the waveform-equalizing circuit and the load-driving circuit being configured by a differential circuit, the load-driving circuit having a gain larger than one, the transmitted data signals being subjected to signal amplification in the load-driving circuit and outputted to the transmission paths.

(2) The transmitter circuit of the above item (1), in which the load-driving circuit is configured by a differential circuit including a first current switching circuit, the first current switching circuit including: first transistors (MOS transistors for differential signal input), in which a first driving current flows, controlled by a voltage value of the transmitted data signals of outputs of the waveform-equalizing circuit; a first current source (MOS transistor for current source), to which the first driving current is applied, connected between the first transistor and a ground voltage; second transistors (MOS transistors for bias voltage application), in which the first driving current flows, cascode-connected to the first transistors and controlled by a voltage value of a first bias voltage; and a first load portion (load resistors), to which the first driving current is applied, connected between the second transistors and a supply voltage.

(3) The transmitter circuit of the above item (1), in which the load-driving circuit is configured by a differential circuit including a first current switching circuit, the first current switching circuit including: first transistors (MOS transistors for differential signal input), in which a first driving current flows, controlled by a voltage value of the transmitted data signals of outputs of the waveform-equalizing circuit; a first current source (MOS transistor for current source), to which the first driving current is applied, connected between the first transistors and a ground voltage; and a first load portion (load resistors), to which the first driving current is applied, connected between the first transistors and a supply voltage.

(4) The transmitter circuit of the above item (1), in which the waveform-equalizing circuit is configured by a differential circuit including one second current switching circuit and one or a plurality of current adder circuits, the second current switching circuit including: third transistors (MOS transistors for differential signal input), in which a second driving current flows, controlled by the voltage value of the transmitted data signals; a second current source (MOS transistor for current source), to which the second driving current is applied, connected between the third transistors and a ground voltage; fourth transistors (MOS transistors for bias voltage application), in which the second driving current flows, cascode-connected to the third transistors and controlled by a voltage value of a second bias voltage; and a second load portion (load resistors), to which the second driving current is applied, connected between the fourth transistors and a supply voltage, the current adder circuit including: fifth transistors (MOS transistors for differential signal input), in which a third driving current flows, controlled by a voltage value of signals obtained by delaying the transmitted data signals; a third current source (MOS transistor for current source), to which the third driving current is applied, connected between the fifth transistors and the ground voltage; and sixth transistors (MOS transistors for bias voltage application), in which the third driving current flows, cascode-connected to the fifth transistors and connected to the second load portion and controlled by a voltage value of a third bias voltage, the second load portion equalizing waveforms of the transmitted data signals by converting a current obtained by adding the third driving current to the second driving current.

(5) The transmitter circuit of the above item (1), in which the waveform-equalizing circuit is configured by a differential circuit including one second current switching circuit and one or a plurality of current adder circuits, the second current switching circuit including: third transistors (MOS transistors for differential signal input), in which a second driving current flows, controlled by the voltage value of the transmitted data signal; a second current source (MOS transistor for current source), to which the second driving current is applied, connected between the third transistors and a ground voltage; and a second load portion (load resistors), to which the second driving current is applied, connected between the fourth transistors and a supply voltage, the current adder circuit including: fifth transistors (MOS transistors for differential signal input), in which a third driving current flows, controlled by a voltage value of signals obtained by delaying the transmitted data signals; and a third current source (MOS transistor for current source), to which the third driving current is applied, connected between the fifth transistors and the ground voltage, the second load portion equalizing a waveform of the transmitted data signal by converting a current obtained by adding the third driving current to the second driving current.

In the foregoing, the invention made by the inventors of the present invention has been concretely described based on the embodiments. However, it is needless to say that the present invention is not limited to the foregoing embodiments and various modifications and alterations can be made within the scope of the present invention.

The transmitter circuit according to the present invention can be used in high-speed interface technology such as backplane high-speed serial transfer, SerDes-IO, etc. in a data transfer system which transmits data to a receiver circuit via transmission paths from the transmitter circuit.

What is claimed is:

1. A transmitter circuit comprising a waveform-equalizing load driving circuit which performs waveform equalization to transmitted data signals and outputs the waveform-equalized transmitted data signals to transmission paths,
   the waveform-equalizing load driving circuit being configured by a differential circuit including one current switching circuit and one or a plurality of current adder circuits,
   the current switching circuit including:
      first transistors in which a first driving current flows, controlled by a voltage value of the transmitted data signal;
      a first current source, to which the first driving current is applied, connected between the first transistors and a ground voltage;
      second transistors, in which the first driving current flows, cascode-connected to the first transistors and controlled by a voltage value of a first bias voltage; and
      a load portion, to which the first driving current is applied, connected between the second transistors and a supply voltage,
   the current adder circuit including:
      third transistors, in which a second driving current flows, controlled by a voltage value of signals obtained by delaying the transmitted data signals;
      a second current source, to which the second driving current flows, connected between the third transistors and the ground voltage; and
      fourth transistors, in which the second driving current flows, cascode-connected to the third transistors to be connected to the load portion and controlled by a voltage value of a second bias voltage, and
   the load portion performing waveform equalization of the transmitted data signals by converting a current obtained by adding the second driving current to the first driving current into a voltage,
   the first transistors, the second transistors, the third transistors, and the fourth transistors are configured by MOS transistors,
   the first current source and the second current source are configured by MOS transistors,
   upon an operation of inputting an 'H' level to a gate voltage of the MOS transistors of the first and third transistors and having an output voltage of an 'L' level (VOL),
   a gate voltage (VCAS) of the MOS transistors of the second and fourth transistors is set to be smaller than a value (VOL+Vth) obtained by adding a threshold voltage (Vth) of the MOS transistors to an output 'L' level,
   a gate voltage (VIN) of the MOS transistors of the first and third transistors is set to be smaller than a value (VSL+Vth) obtained by adding a threshold voltage (Vth) of the MOS transistors to a drain voltage (VSL), and
   a gate voltage (VBIAS) of the MOS transistors of the first and second current sources is set to be smaller than a value (Vds+Vth) obtained by adding a threshold voltage (Vth) of the MOS transistors to a drain voltage (Vds).

2. A transmitter circuit, comprising:
   a waveform equalizing circuit performing waveform equalization to a transmitted data signal; and
   a load driving circuit, connected to the waveform equalizing circuit in series, outputting the transmitted data signals after the waveform equalization in the waveform equalizing circuit to transmission paths,
   wherein the load driving circuit is configured by a differential circuit including a first current switching circuit,
   wherein the first current switching circuit includes:
      first transistors, in which a first driving current flows, controlled by a voltage value of the transmitted data signals at outputs of the waveform equalizing circuit;
      a first current source, to which the first driving current is applied, connected between the first transistors and a ground voltage;
      second transistors, in which the first driving current flows, cascode-connected to the first transistors and controlled by a voltage value of a first bias voltage; and
      a first load portion, to which the first driving current is applied, connected between the second transistors and a supply voltage,
   wherein the waveform equalizing circuit is configured by a differential circuit including one second current switching circuit and one or a plurality of current adder circuits,
   wherein the second current switching circuit includes:
      third transistors, in which a second driving current flows, controlled by a voltage value of the transmitted data signal;
      a second current source, to which the second driving current is applied, connected between the third transistors and a ground voltage;
      fourth transistors, in which the second driving current flows, cascode-connected to the third transistors and controlled by a voltage of a second bias voltage; and
      a second load portion, to which the second driving current is applied, connected between the fourth transistors and a supply voltage,
   wherein the current adder circuit includes:
      fifth transistors, in which a third driving current flows, controlled by a voltage value of signals obtained by delaying the transmitted data signals;
      a third current source, to which the third driving current flows, connected between the fifth transistors and a ground voltage; and
      sixth transistors, in which the third driving current flows, cascode-connected to the fifth transistors to be connected to the second load portion and controlled by a voltage value of a third bias voltage, and
   wherein the second load portion performs waveform equalization of the transmitted data signals by converting a current obtained by adding the third driving current to the second driving current into a voltage.

3. A transmitter circuit, comprising:
a waveform equalizing circuit performing waveform equalization to a transmitted data signal; and
a load driving circuit, connected to the waveform equalizing circuit in series, outputting the transmitted data signals after the waveform equalization in the waveform equalizing circuit to transmission paths,
wherein the load driving circuit is configured by a differential circuit including a first current switching circuit,
wherein the first current switching circuit includes:
first transistors, in which a first driving current flows, controlled by a voltage value of the transmitted data signals at outputs of the waveform equalizing circuit;
a first current source, to which the first driving current is applied, connected between the first transistors and a ground voltage;
second transistors, in which the first driving current flows, cascode-connected to the first transistors and controlled by a voltage value of a first bias voltage; and
a first load portion, to which the first driving current is applied, connected between the second transistors and a supply voltage,
wherein the first transistors and the second transistors are configured by MOS transistors,
wherein the first current source is configured by a MOS transistor,
wherein upon an operation of inputting an 'H' level to a gate voltage of the MOS transistors of the first transistors and having an output voltage of an 'L' level (VOL),
a gate voltage (VCAS) of the MOS transistors of the second transistors is set to be smaller than a value (VOL+Vth) obtained by adding a threshold voltage (Vth) of the MOS transistors to an output 'L' level,
a gate voltage (VIN) of the MOS transistors of the first transistors is set to be smaller than a value (VSL+Vth) obtained by adding a threshold voltage (Vth) of the MOS transistors to a drain voltage (VSL), and
a gate voltage (VBIAS) of the MOS transistor of the first current source is set to be smaller than a value (Vds+Vth) obtained by adding a threshold voltage (Vth) of the MOS transistor to a drain voltage (Vds).

4. A transmitter circuit, comprising:
a waveform equalizing circuit performing waveform equalization to a transmitted data signal; and
a load driving circuit, connected to the waveform equalizing circuit in series, outputting the transmitted data signals after the waveform equalization in the waveform equalizing circuit to transmission paths,
wherein the load driving circuit is configured by a differential circuit including a first current switching circuit,
wherein the first current switching circuit includes:
first transistors, in which a first driving current flows, controlled by a voltage value of the transmitted data signals at outputs of the waveform equalizing circuit;
a first current source, to which the first driving current is applied, connected between the first transistors and a ground voltage;
second transistors, in which the first driving current flows, cascode-connected to the first transistors and controlled by a voltage value of a first bias voltage; and
a first load portion, to which the first driving current is applied, connected between the second transistors and a supply voltage,
wherein the waveform equalizing circuit is configured by a differential circuit including one second current switching circuit and one or a plurality of current adder circuits,
wherein the second current switching circuit includes:
third transistors, in which a second driving current flows, controlled by a voltage value of the transmitted data signal;
a second current source, to which the second driving current is applied, connected between the third transistors and a ground voltage;
fourth transistors, in which the second driving current flows, cascode-connected to the third transistors and controlled by a voltage of a second bias voltage; and
a second load portion, to which the second driving current is applied, connected between the fourth transistors and a supply voltage,
wherein the current adder circuit includes:
fifth transistors, in which a third driving current flows, controlled by a voltage value of signals obtained by delaying the transmitted data signals;
a third current source, to which the third driving current flows, connected between the fifth transistors and a ground voltage; and
sixth transistors, in which the third driving current flows, cascode-connected to the fifth transistors to be connected to the second load portion and controlled by a voltage value of a third bias voltage, and
wherein the second load portion performs waveform equalization of the transmitted data signals by converting a current obtained by adding the third driving current to the second driving current into a voltage,
wherein the third transistors, the fourth transistors, the fifth transistors, and the sixth transistors are configured by MOS transistors,
wherein the second current source and the third current source are configured by MOS transistors,
wherein upon an operation of inputting an 'H' level to a gate voltage of the MOS transistors of the third and fifth transistors and having an output voltage of an 'L' level (VOL),
a gate voltage (VCAS) of the MOS transistors of the fourth and sixth transistors is set to be smaller than a value (VOL+Vth) obtained by adding a threshold voltage (Vth) of the MOS transistors to an output 'L' level,
a gate voltage (VIN) of the MOS transistors of the third and fifth transistors is set to be smaller than a value (VSL+Vth) obtained by adding a threshold voltage (Vth) of the MOS transistors to a drain voltage (VSL), and
a gate voltage (VBIAS) of the MOS transistors of the second and third current sources is set to be smaller than a value (Vds+Vth) obtained by adding a threshold voltage (Vth) of the MOS transistors to a drain voltage (Vds).

* * * * *